United States Patent
Schulz et al.

(10) Patent No.: US 10,288,702 B2
(45) Date of Patent: May 14, 2019

(54) SYSTEM FOR SIMULTANEOUS PET/MR IMAGING

(71) Applicant: KONINKLIJKE PHILIPS N.V., Eindhoven (NL)

(72) Inventors: Volkmar Schulz, Wuerselen (DE); Yannick Berker, Witten (DE); Jakob Adrian Clemens Wehner, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 628 days.

(21) Appl. No.: 14/966,453

(22) Filed: Dec. 11, 2015

(65) Prior Publication Data

US 2016/0103194 A1  Apr. 14, 2016

Related U.S. Application Data

(63) Continuation-in-part of application No. PCT/IB2014/063907, filed on Aug. 14, 2014.

(Continued)

(51) Int. Cl.
*G01R 33/48* (2006.01)
*G01R 33/422* (2006.01)
(Continued)

(52) U.S. Cl.
CPC ......... *G01R 33/481* (2013.01); *G01R 33/422* (2013.01); *G01R 33/4818* (2013.01); *G01R 33/56518* (2013.01); *G01R 33/58* (2013.01)

(58) Field of Classification Search
CPC .............. G01R 33/481; G01R 33/4818; G01R 33/422; G01R 33/56518
See application file for complete search history.

(56) References Cited

U.S. PATENT DOCUMENTS

| 7,522,952 B2 | 4/2009 | Krieg et al. |
| 7,626,389 B2 | 12/2009 | Fiedler et al. |

(Continued)

FOREIGN PATENT DOCUMENTS

| WO | 2006/071922 | 7/2006 |
| WO | 2012143571 | 10/2012 |
| WO | 2012143574 | 10/2012 |

OTHER PUBLICATIONS

Barmet et al., A Third-Order Field Camera with Microsecond Resolution for MR System Diagnostics, In Proceedings of the 17th Annual Meeting of ISMRM, Honolulu, Hawaii, USA, 2009.*

(Continued)

*Primary Examiner* — Daniel R Miller

(57) ABSTRACT

A combined PET/MR system includes an MR subsystem including a main field magnet (14) which generates a stationary magnetic field through an examination region (16), a gradient magnetic field system (18, 20, 22, 24) which applies magnetic field gradients across the examination region, and an RF system (26, 28, 32, 34, 36, 38) that applies RF excitation pulses to excite resonance in a subject in the examination region and receive magnetic resonance signals from the subject. A PET detector module (70) which is permanently or removably fixed in the examination region (16) to detect radiation from radiopharmaceuticals injected into the subject causes distortions in the magnetic field gradients. A plurality of probes (90) which are mounted in a fixed relationship to the PET detector module (70) measure magnetic field strength. A gradient magnetic field distortion correction system (110) determines distortions caused in the gradient magnetic fields and corrects the magnetic resonance signals accordingly. The PET detector module includes a plurality of RF shielded detector units (132) which are mounted in a circumferentially spaced relationship with a (Continued)

gap (136) there between through which RF excitation pulses and magnetic resonance signals pass.

17 Claims, 4 Drawing Sheets

Related U.S. Application Data

(60) Provisional application No. 61/866,141, filed on Aug. 15, 2013.

(51) Int. Cl.
*G01R 33/565* (2006.01)
*G01R 33/58* (2006.01)

(56) References Cited

U.S. PATENT DOCUMENTS

| | | | |
|---|---|---|---|
| 8,131,340 B2 | 3/2012 | Eberlein et al. | |
| 2005/0024051 A1* | 2/2005 | Doddrell | A61B 5/7257 324/307 |
| 2005/0218892 A1 | 10/2005 | Pruessmann et al. | |
| 2009/0295389 A1 | 12/2009 | Pruessmann et al. | |
| 2010/0033186 A1* | 2/2010 | Overweg | A61B 5/055 324/318 |
| 2010/0217112 A1 | 8/2010 | Choi et al. | |
| 2012/0022362 A1 | 1/2012 | Caruba et al. | |
| 2012/0249141 A1 | 10/2012 | Blumhagen et al. | |

OTHER PUBLICATIONS

Aitken, "Rapid aquisition of PET attenuation maps from highly undersampled UTE images using Sparse-Sense reconstruction", proceedings of the international society for magnetic resonance in medicine, ISMRM, 21st annual meeting and exhibition, Apr. 2013.
Skope, "Dynamic Field Camera Skope DFC-S16", Dec. 10, 2011 XP055157983.
Barmet, "Spatiotemporal Magnetic Field Monitoring for MR", Jul. 1, 2008, Magnetic Resonance in Medicine.
Aitken, "Improved UTE-based attenuation correction for cranial PET-MR using dynamic magnetic field monitoring", Medical Physics, AIP, Melville, NY, US, vol. 41, No. 1, Dec. 17, 2013.
Barmet, "A transmit/receive system for magnetic field monitoring of in-vivo MRI", Magn Reson Med 62(1), 269-76, 2009.
Giese, "Analysis and correction of background velocity offsets in phase-contrast flow measurements using magnetic field monitoring", Magn Reson Med 67(5), 1294-302, 2012.
Vannesjo, "Gradient system characterization by impulse response measurements with a dynamic field camera", Magnetic Resonance in Medicine, 2013.

* cited by examiner

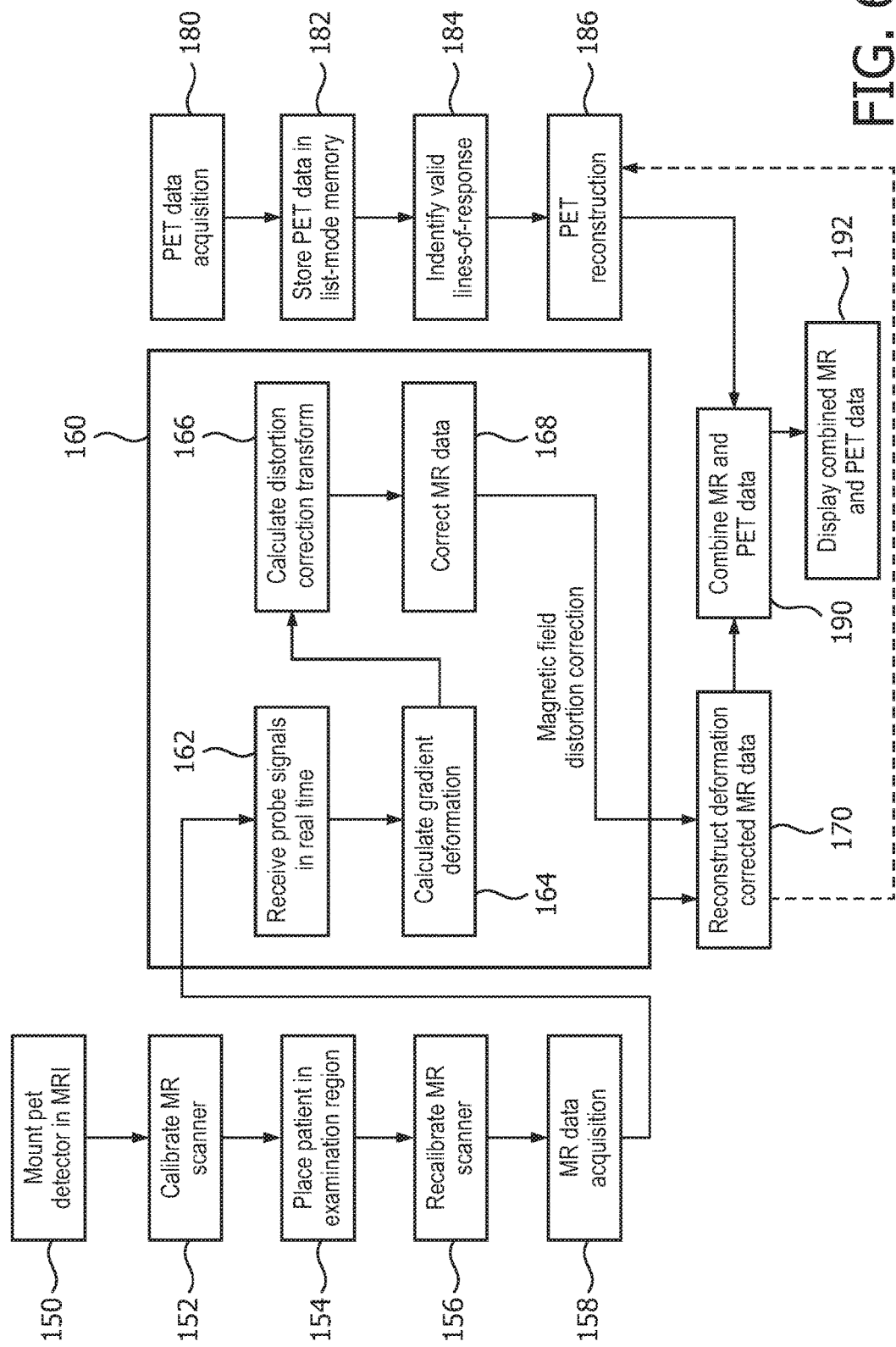

SYSTEM FOR SIMULTANEOUS PET/MR IMAGING

This application is a Continuation-in-Part of PCT application Ser. No. PCT/IB2014/063907, filed Aug. 14, 2014, published as WO 2015/022660 on Feb. 19, 2015, which claims the benefit of U.S. Provisional Application No. 61/866,141 filed Aug. 15, 2013, which is incorporated herein by reference.

The present application relates generally to medical imaging. It finds particular application in conjunction with a combined magnetic resonance (MR) imaging and nuclear imaging, particularly positron emission tomography (PET) imaging, and will be described with particular reference thereto. However, it will be understood that it also finds application in other usage scenarios and is not necessarily limited to the aforementioned application.

In magnetic resonance imaging, a patient is positioned in a uniform magnetic field, $B_0$, which preferentially aligns the nuclear spins in the body. Gradient coils, located within the bore of the MRI apparatus, generate spatially varying gradient magnetic fields across the field $B_0$. A radio frequency (RF) antenna and RF transmitter generate RF pulses that excite the nuclear spins. The same or a different antenna receives the resonance RF signal induced by the excited nuclear spins which are forwarded to a receiver.

Magnetic resonance imaging (MRI) has recently been combined with Positron Emission Tomography (PET) for clinical and preclinical applications. MRI systems consist basically of three main components, namely a strong magnet for creating a homogeneous magnetic ($B_0$) field, a magnetic field gradient system ("gradients") for spatially encoding the signal, and a radio frequency (RF) system for resonance excitation and readout. All of these components can interfere with material introduced into the MRI apparatus.

In a PET imaging system, the imaging apparatus creates images of metabolic activity in the body, rather than creating images of surrounding anatomy. Before having a PET scan, the patient receives a dose of a radiopharmaceutical, which decays during the scan, emitting pairs of gamma rays. During the scan, a distribution of tracings of the emitted radiation are detected by the system and reconstructed to create an image of the distribution of the radiopharmaceutical in the patient. The image can, for example, show the circulatory system and/or the relative absorption of the radiopharmaceutical in various regions or organs.

Introducing a PET detector into the bore of an MRI apparatus is particularly challenging because of the potential to interfere with all subsystems of each other.

An issue with introducing a PET imaging device into the bore or examination region of a magnetic resonance scanner is that there is a significant problem with induced eddy currents, which counteract in part and otherwise cause the gradient magnetic fields to be non-linear, i.e., distorted. More specifically, in terms of gradients, during switching, the local magnetic field changes as a function of time and induces eddy currents in conducting material such as those used to construct the PET detector. The magnetic field created by these eddy currents is, according to Lenz's law, opposed to the eddy current's origin, namely the change of gradients strength. Thus, the presence of the PET detector introduces non-linearities and distortions into the magnetic field gradients. Moreover, in terms of RF excitation, the PET detector blocks the propagation of RF excitation pulses, and the RF resonance signal. Additionally, in terms of the $B_0$ field, the PET detector creates inhomogeneities by the presence of magnetically susceptible material. Magnetic field inhomogeneities result in loss of signal due to dephasing of spins.

However, suboptimal gradient performance in MRIs is known to occur even without PET. For example, introducing a subject into the examination region may cause drifts in the spatially homogenous $B_0$ field component, and cause image defects such as ghosting, blurring, shifts, and distortions.

The following discloses a new and improved combined MR and PET scanner with retrospective eddy current calibration for combined PET/MR imaging which addresses the above referenced issues, and others.

In accordance with one aspect, a combined PET/MR system is provided. An MR system includes a main field magnet which generates a stationary magnetic field through the examination region, a gradient magnetic field system which applies magnetic field gradients across the examination region, and an RF system that applies RF excitation pulses to excite resonance in a subject/volume of interest in the examination region and receive magnetic resonance signals from the subject/volume of interest. A PET detector module is permanently or removably fixed in the examination region to detect radiation from radiopharmaceuticals injected in the subject/volume of interest. A plurality of RF probes which measure magnetic field strength are mounted in the examination region in a fixed relationship to the PET detector module. A gradient magnetic field distortion correction system determines distortions in the gradient magnetic fields and corrects the magnetic resonance signals in accordance with the determined distortion. A magnetic resonance reconstruction system reconstructs the corrected magnetic resonance signals into an image representation.

In accordance with another aspect, a combined PET/MR system is provided. An MR subsystem includes a main field gradient which generates a stationary magnetic field through the examination region, a gradient magnetic field system which applies magnetic field gradients across the examination region, and an RF system which applies RF excitation pulses to excite resonance in a subject in the examination region and to receive magnetic resonance signals from the subject. The system includes a plurality of PET detector units and RF shielding which individually RF shields each PET detector unit. The RF shielded PET detector units are mounted in a circumferentially spaced relationship with a gap there between through which RF excitation pulses and magnetic resonance signals pass.

In accordance with another aspect a combined PET/MR system is provided. The PET/MR system includes a main field magnet configured to generate a stationary magnetic field through an examination region, a gradient magnetic field system configured to apply magnetic field gradients across the examination region, and an RF system configured to apply RF excitation pulses to excite resonance in a volume of interest in the examination region and to receive magnetic resonance signals from the volume of interest. A PET detector module is permanently or removably fixed in the examination region and is configured to detect radiopharmaceuticals in the volume of interest. A processor is configured to select, based on a current PET detector module location in the examination region, a distortion correction map from a library of distortion correction maps, and to apply the selected distortion correction map to the magnetic resonance signals to correct for distortions in the gradient magnetic fields. An MR reconstruction system is configured to reconstruct the corrected magnetic resonance signals into an image representation.

In accordance with another aspect, a method of combined PET/MR imaging is provided with a PET detector module permanently or removably fixed in an examination region of an MR scanner. An MR imaging sequence is applied with the MR scanner, which sequence includes applying magnetic field gradients across the examination region, inducing magnetic resonance in a subject in the examination region, and receiving magnetic resonance signals from the subject. Magnetic field strength in the examination region during the application of the magnetic field gradients is measured with a plurality of RF probes which are mounted in a fixed relationship with the PET detector module. Distortions caused in the applied gradient magnetic fields are determined and the received magnetic resonance signals are corrected in accordance with the determined distortion. The corrected magnetic resonance signals are reconstructed into an image representation.

In accordance with another aspect a method of combined PET/MR imaging with a PET detector module permanently or removably fixed in an examination region of an MR scanner. The method comprises, with the MR scanner, applying an MR imaging sequence including: applying magnetic field gradients across the examination region, which applied magnetic field gradients are distorted by the PET detector module, inducing magnetic resonance in a volume of interest in the examination region, receiving magnetic resonance signals from the volume of interest. The method further includes, with a processor, receiving input indicative of a current PET detector module location in the examination region, and, with the processor, selecting, based on the current PET detector module location in the examination region, a distortion correction map from a library of distortion correction maps, and applying the selected distortion correction map to the magnetic resonance signals to correct for distortions in the gradient magnetic fields. The method further includes reconstructing the corrected magnetic resonance signals into an MR image representation.

One advantage resides in inserting a dynamic field camera, such as a PET detector in the MRI bore.

Another advantage is that gradient magnetic field distortion, such as due to eddy currents, can be compensated.

Another advantage resides in correcting for $B_0$ field distortions. Another advantage is that gradient magnetic field distortion, such as due to eddy currents, can be compensated automatically without having to perform repeated distortion calibration cycles.

The invention may take form in various components and arrangements of components, and in various steps and arrangements of steps. The drawings are only for purposes of illustrating the preferred embodiments and are not to be construed as limiting the invention.

FIG. 6 is a flow chart depicting a method in accordance with the present application.

Figure 1:
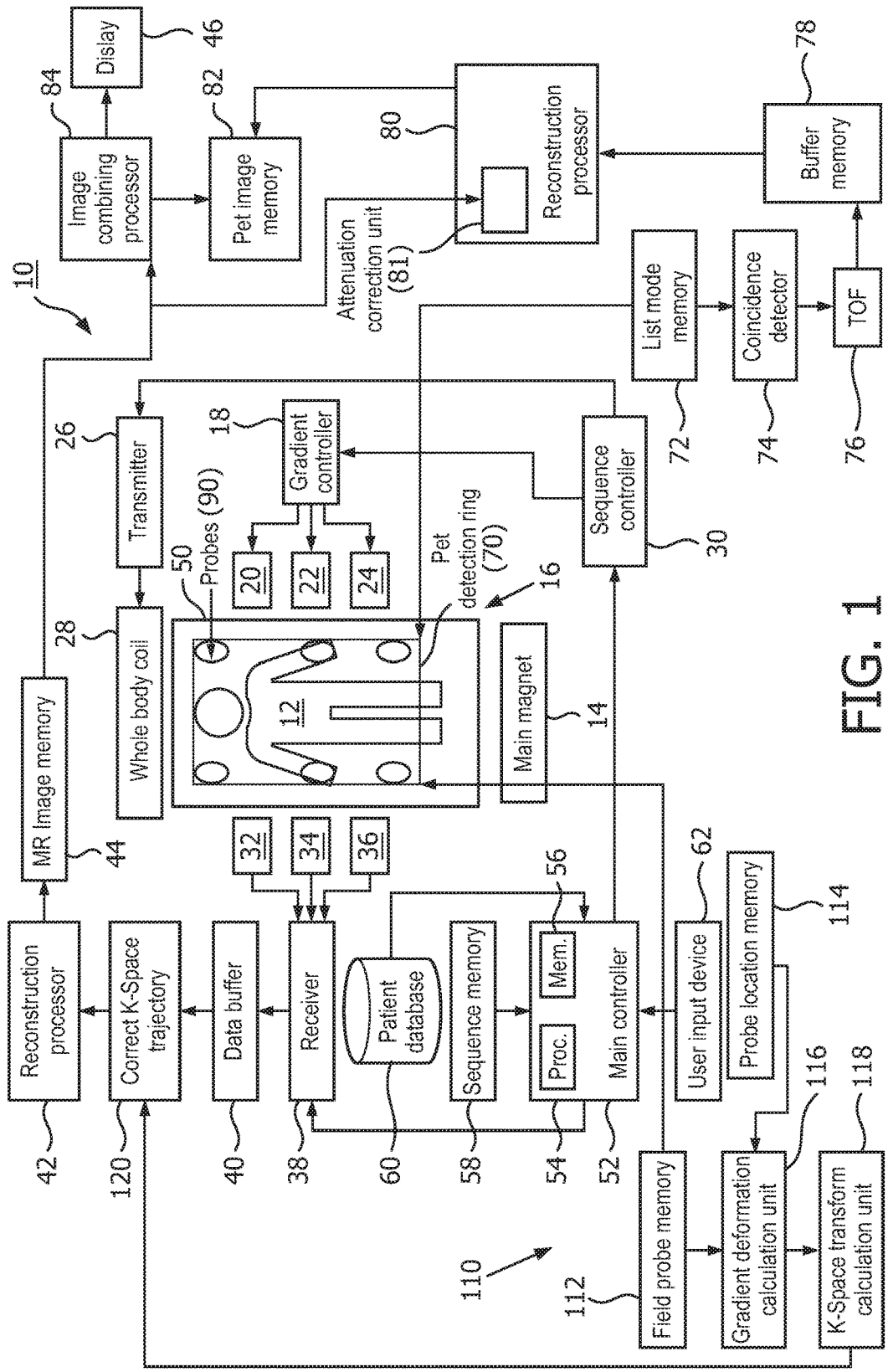
FIG. 1 illustrates a combined magnetic resonance (MR) and Positron Emission Tomography (PET) system.

With reference to FIG. 1, a magnetic resonance (MR) system 10 utilizes magnetic resonance to form two- or three-dimensional images of a subject 12. The system 10 includes a main magnet 14 that creates a strong, static $B_0$ magnetic field extending through an examination volume 16. The examination volume 16 is sized to accommodate the subject 12. The strength of the static $B_0$ magnetic field is commonly one of 0.23 Tesla, 0.5 Tesla, 1.5 Tesla, 3 Tesla, 7 Tesla, and so on in the examination region 16, but other strengths are contemplated.

A gradient controller 18 controls a plurality of magnetic field gradient coils 20, 22, 24 to selectively superimpose magnetic field gradients, such as x, y and z gradients, on the static $B_0$ magnetic field in the examination volume 16. Further, a transmitter 26 transmits $B_1$ resonance excitation and manipulation radiofrequency (RF) pulses into the examination volume 16 with one or more transmit coils 28, such as a whole body coil. The $B_1$ pulses are typically of short duration and, when taken together with the magnetic field gradients, achieve a selected manipulation of magnetic resonance. For example, the $B_1$ pulses excite the hydrogen dipoles to resonance and the magnetic field gradients encode spatial information in the frequency and phase of the resonance signal. By adjusting the RF frequencies, resonance can be excited in other dipoles, such as phosphorous, which tend to concentrate in known tissues, such as bones. A sequence controller 30 controls the transmitter 26 and/or the gradient controller 18 to implement a selected imaging sequence within the examination volume 16, the imaging sequence defining a sequence of $B_1$ pulses and/or magnetic field gradients.

In response to an imaging sequence, spatially encoded magnetic resonance signals corresponding to a map or image of the subject 12 are produced from the examination volume 16. These spatially encoded magnetic resonance signals are received by a plurality of receive coils 32, 34, 36, such as a whole body receive coil or local receive-only coils. A receiver 38 demodulates the received signals to an MR data set corresponding to, for example, k-space data trajectories and stores the MR data set in a data buffer (e.g., a memory) 40. The MR data set can be employed for reconstruction of a map or image by a reconstruction processor 42. The reconstruction processor 42 spatially decodes the spatial encoding by the magnetic field gradients to ascertain a property of the resonance signal from each spatial region, such as a pixel or voxel. The intensity or magnitude of the signal is commonly ascertained, but other properties related to phase, relaxation time, magnetization transfer, and the like can also be ascertained. Further, the real and the imaginary parts of the signal can be used to determine phase and/or magnitude. The converse also holds. Reconstructed maps or images of various properties are then stored in map and image memories 44 and, optionally, displayed on a display device 46.

With continuing reference to FIG. 1, during imaging, the subject 12 is arranged in the examination volume 16. The main magnet 14 generates the static $B_0$ magnetic field with which hydrogen or other nuclear dipoles in the subject 12 preferentially align. Further, a main controller 52 controls the sequence controller 30 and the receiver 38 to generate a plurality of MR data sets of the subject 12. The main controller 52 does so by way of a processor 54 executing computer executable instructions on a memory 56.

A sequence memory 58 stores a plurality of magnetic resonance sequences that are known in the art. The various sequences have been developed to optimize various functional, physiological and anatomical examinations. Sequences have been developed for differentiating lipids and soft tissue, for differentiating between soft tissue and scar tissue, for differentiating between cancerous and non-cancerous tissue, for differentiating various organ or tissue types, for measuring perfusion, for imaging or identifying bone, for imaging or locating metal, and many more. The main controller 52 can access a patient records database 60 to retrieve information about one or more of the patient to be examined, the nature of the examination(s) to be conducted, and the like. This patient information can be used to help select among the sequences stored in the sequence memory 58. For example, if the patient has had surgery in which metal clips, screws, stents or the like have been implanted, the sequence for identifying metal is selected. A sequence for identifying scar tissues is also retrieved if the nature of the patient treatment calls for differentiating between the radiation attenuation of soft tissue and scar tissue. The sequence controller 30 is controlled according to the selected imaging sequences, and the receiver 38 is controlled to generate an MR data set corresponding to each of the imaging sequences. When the imaging sequences include a plurality of imaging sequences, the main controller 52 iterates through the imaging sequences to control the sequence controller 30 and the receiver 38.

A PET detector module, which in one embodiment is an insert, is fixedly mounted permanently or removably in the imaging region 16 of the MRI scanner. The PET detector module includes an array of PET detectors, such as scintillators optically coupled with silicon photomultipliers, or the like, which detect the gamma rays emitted during PET imaging, is permanently mounted in the imaging region 16 of the MRI scanner. A power supply, clock, analog-to-digital converters, and other processing circuitry, associated with the array of PET detectors, may also be permanently mounted in the imaging region 16 of the MRI scanner. The PET data including the time, location, and amplitude of detected gamma radiation events are stored in a list-mode memory 72. A coincidence detector 74 examines the PET data from the list-mode memory 72 to find coincident pairs of detected radiation events. In PET imaging, the breakdown of the radioisotope tracer causes an annihilation event and the emission of a pair of gamma rays travelling in diametrically opposed directions (for conservation of energy). Pairs of radiation events which occur within a predefined coincidence time window of each other are taken as detections of such a pair of radiation events to define a line-of-response (LOR). Optionally, a time-of-flight detector 76 compares the relative detection times of the coincident pair of gamma detection events to localize the location of the annihilation event along the LOR. The coincident events and time-of-flight information are loaded into a buffer memory 78 and reconstructed by a reconstruction processor 80 into a PET image which is stored in a PET image memory 82. An image combining module or processor 84 receives the MR image from the MR image memory 44 and the PET image from the PET image memory 82 and combines the two images for display on the display 46. For example, the PET and MR images can be superimposed to superimpose a map of the distribution of the radiopharmaceutical on an image of the anatomy of the patient.

In an alternative embodiment, an array of PET detectors may form a PET detector module 70 removably mounted in the imaging region 16 of the MRI scanner. A power supply, clock, analog-to-digital converters, and other processing circuitry, associated with the PET detector module 70, may also be removably mounted in the imaging region 16 of the MRI scanner.

The application of gradients by the gradient system 18, 20, 22, 24 of the MRI scanner induces eddy currents in the PET detector module 70. These eddy currents induce opposing gradient magnetic fields in the examination region. The eddy currents decay over time. The eddy currents cause distortions in the gradient magnetic fields, and, as a result, in the received magnetic resonance data. The distorted magnetic resonance data, if uncorrected, will cause artifacts and distortions in the reconstructed MR image.

Figure 2:
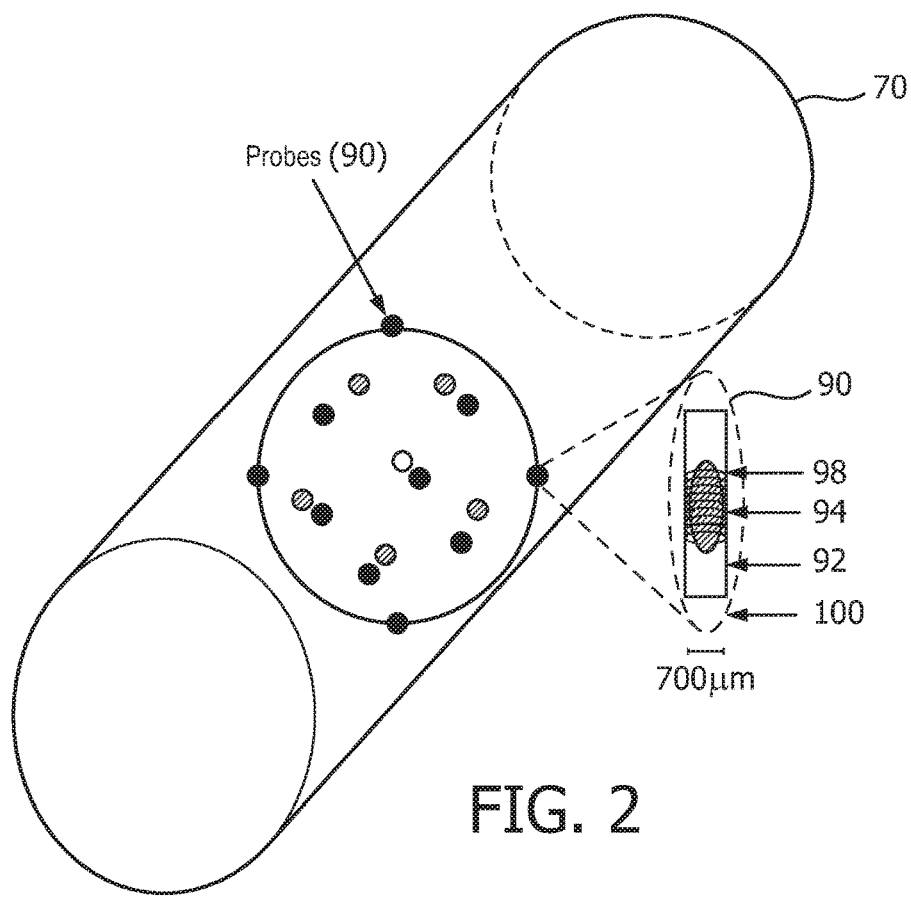
FIG. 2 illustrates a PET insert with a plurality of probes.

With reference to FIG. 2, a plurality of probes 90 are attached to the PET module 70 in known locations on the insert. The PET insert is mounted, permanently or removably, at a known location in the magnetic resonance imager. Alternatively, probes are carried on a third, independent structure which is inserted in the MR field and locked in a known location to the PET and MR systems. Each probe 90 contains a magnetic resonance inert vial, such as a cylindrical glass capillary 92 containing a droplet 94 which exhibits magnetic resonance at an operating frequency, such as water, water doped with additives, oil, or the like. A coil 98 is wound around the vial 92 forming multiple loops surround the droplet 94 for receiving a magnetic resonance signal therefrom whose frequency is indicative of magnetic field strength. For greatest sensitivity, the conductive coil 98 is oriented perpendicular to the magnetic field $B_0$. The probe structure may be encased in a casing 100.

By looking at the frequency of the signals from the coils of the probes (knowing their physical location in the scanner), at what magnetic field is expected at each location, one can readily determine the distortion in the gradients. Once the gradient distortion is known and the distortion in the read-out data is known, then a simple transform can be applied to transform the distorted k-space data lines into linear k-space data lines for conventional reconstruction.

Referring again to FIG. 1, a distortion correction system 110 includes a magnetic field probe memory or buffer 112 which receives the signals from the coils 98 of the probes 90. A probe location memory 114 stores the physical location of each of the probes 90. A gradient deformation calculation unit or processor 116 calculates the deformation in the applied magnetic field gradient. More specifically, the gradient deformation calculation unit 116 receives the strength of the gradient to be applied from the main controller 52 and the probe locations from the probe location memory 114 and calculates what the frequency of the signal of each probe would have been if there were no eddy currents or other distortions. By comparing the actual frequency of the signals from each probe 90 with the eddy current altered frequency, the gradient deformation calculation unit 116 determines how the gradient magnetic fields have been distorted.

A k-space transform calculation unit or processor 118 calculates a transform for transforming the distorted magnetic resonance gradient into a linear gradient. A k-space trajectory correction unit or processor 120 transforms each data line of magnetic resonance image data from the data buffer 40 into linear k-space. With the data in linear k-space, any of a variety of conventional reconstruction algorithms can be implemented by the reconstruction processor 42. The k-space trajectory transform can be applied as part of the reconstruction by the reconstruction processor 42 instead of being performed by a separate k-space trajectory correction unit or processor 120.

The magnetic field gradient distortion measurement and the gradient field correction can be performed as a preliminary scan prior to positioning the patient in the scanner. Alternately, because each of the probes has its own read-out channel, the probe signals are readily distinguished from the MR signals, allowing the gradient magnetic field distortion measurements to be made concurrently with the collection of MR image data.

In another configuration described with reference to FIG. 1, units 114, 116 and 118 may be omitted, and instead, processor 120 may be configured to correct the magnetic resonance signals for distortion by applying to the magnetic resonance image data, a distortion correction map that is selected from a library of distortion correction maps. The library of distortion correction maps associates each of a plurality of PET detector module locations in the MR examination region 16 with a distortion correction map. The distortion correction map is preferably a gradient magnetic field distortion correction map and may for example include a k-space transform for transforming magnetic resonance data into linear k-space. The PET detector module location may be input by a user, e.g. user input device 62, or this may be sensed automatically, for example by a camera, or optical or pressure-sensors located at each of the plurality of possible PET detector module locations in the MR imaging region. The library may be stored in a memory such as memory 56. The library of distortion correction maps, or k-space transforms, may be generated as described above, i.e. using a plurality of RF probes 90 to calculate the deformation in the applied magnetic field gradient, during a calibration phase. After the calibration phase the RF probes are no longer required and so these may optionally be subsequently removed from the examination region. Thus when the PET detector module is mounted, permanently or removably, at a known location in the magnetic resonance imager, the relevant distortion correction map or k-space transform can be retrieved from the memory and applied to the MR data without the need to determine the distortion each time the MR data is collected.

Figure 3:
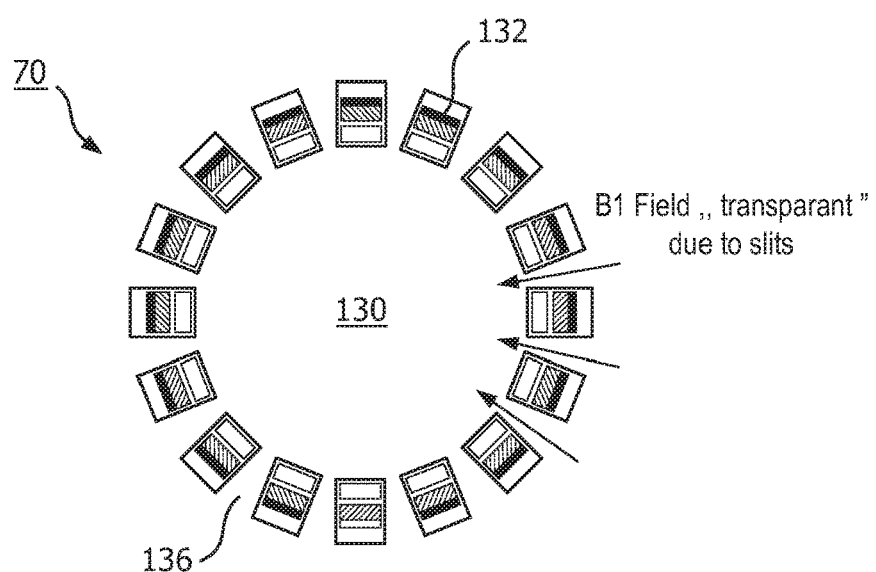
FIG. 3 illustrates a transverse cross-sectional view of the PET insert.

With reference to FIG. 3, the PET detector module 70 includes an end wall 130 disposed at one end of the magnetic resonance imaging bore from which a plurality of circumferentially-spaced PET reception units 132 extends in parallel. To protect the PET detector from RF interference, each individual PET unit 132 is individually shielded with an RF shield 134. To make the PET insert RF translucent, gaps 136 are defined between the shielding through which the RF signals can pass. In the illustrated embodiment, the RF shields surrounding scintillator crystals, SiPMs, associated circuitry, cooling channels, and the like. The PET reception units 132 each extend the length of the volume of interest 16 and are arranged parallel to each other in a cylindrical pattern with the gaps 136 in between. Each of these PET units 132 or arms includes multiple PET sensors.

Figure 4:
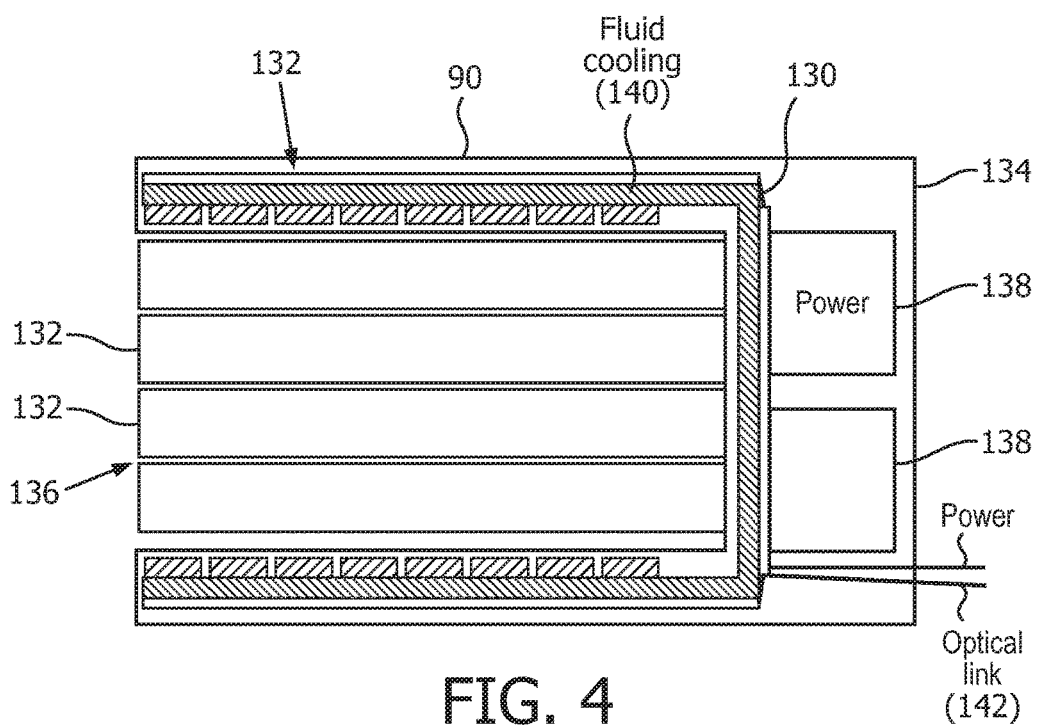
FIG. 4 illustrates a side view in transverse section of a PET insert module.

With reference to FIG. 4, the RF shield 134 individually covers each of the modules or arms like a glove covers the fingers of a hand and also encompasses the end wall 130 and power electronics and processing circuitry 138. Fluid cooling 140 and an optical link 142 are also contained therein.

Figure 5:
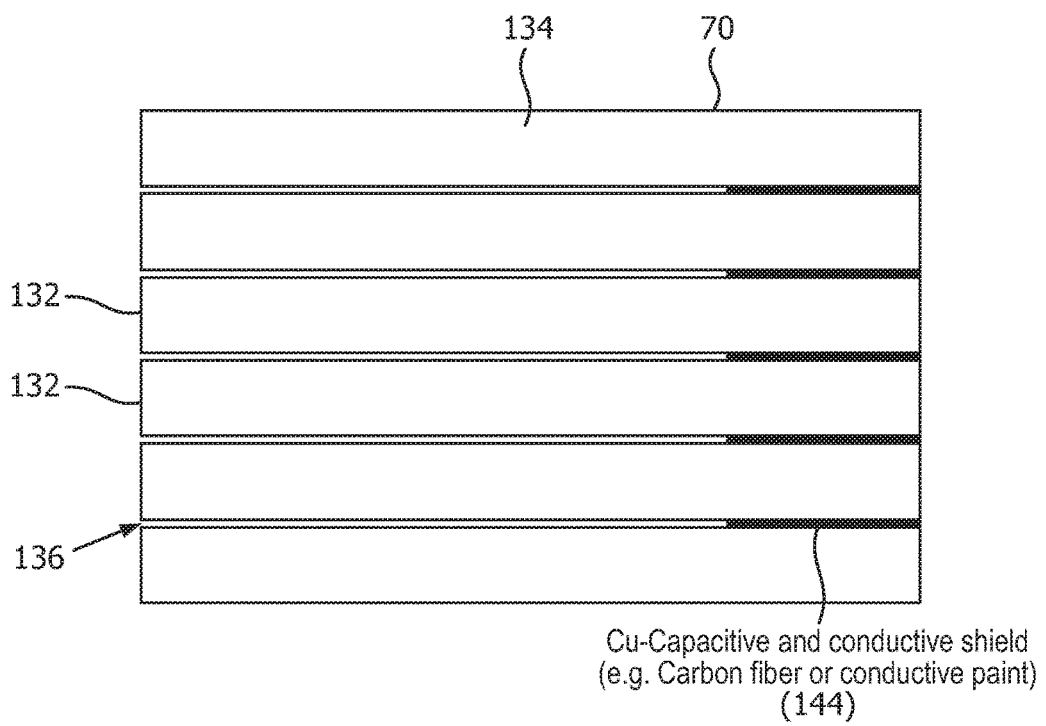
FIG. 5 illustrates a side view of an RF-shielded PET insert module.

With reference to FIG. 5, a side view of the PET detector/PET insert module 70 is disclosed. The copper RF shielding 134 surrounds each reception unit 132 and is connected via capacitive connections to keep the RF transmit pulse from reaching the PET electronics. Additionally, the shielding includes a low conductive material 144, such as carbon fiber, to shield the broad band noise from the PET.

With reference to FIG. 6, in an assembly step 150, the PET detector insert 70 is inserted into the examination volume 16 of the magnetic resonance imaging system. In an initial calibration step 152, the magnetic resonance scanner is recalibrated. For example, the distortion in the magnetic field gradients is measured using the probes 90 and the distortion correction system 110 and the gradient controller 18 is adjusted to linearize the applied gradient magnetic fields. In a patient preparation step 154, the patient is injected with the radiopharmaceutical tracer and positioned in the examination region 16. In a second pre-scan calibration step 156, the MR scanner is recalibrated, including adjusting the gradient controller 18 in order to account for further distortions caused by the presence of the patient.

In a magnetic resonance data acquisition step 158, the sequence controller 30 controls the gradient controller 18 and the transmitter 26 to implement a selected magnetic resonance imaging sequence. During the imaging, a real-time gradient magnetic field distortion correction step 160 is performed. During the real-time gradient magnetic field distortion correction, in a step 162, the signals from the probes 90 are received in real-time at the gradient deformation calculation unit 116. The gradient deformation calculation unit 116 calculates the gradient deformation in a step 164 and the k-space transform calculation unit 118 calculates the distortion correction transform in a step 166. In a step 168, the magnetic resonance data is corrected in accordance with the calculated k-space transform. By calculating the transform during imaging, temporal variations in the gradient magnetic fields attributable to the induced eddy currents are calculated and the image data are corrected. In a step 170, the deformation corrected magnetic resonance data are reconstructed into the magnetic resonance image.

Before, after, or during the magnetic resonance imaging process 158, a PET data acquisition step 180 is performed to acquire the PET data with the PET detector insert 70. In a list-mode PET data storage step 182, the PET data is stored in the list-mode memory 72. In an LOR identifying step 184, the coincidence detector 74 and the time-of-flight calculation unit 76 identify the valid lines-of-response. In a PET reconstruction step 186, the valid lines-of-response are reconstructed into a PET image by the PET reconstruction unit 80.

In an image combining step 190, the magnetic resonance and PET images are appropriately processed, e.g., weighted, and combined. In a display step 192, the combined PET and MR image are displayed. The image processing step 190 can combine the MR and PET images in various ways as are known in the art. The image combining processor 84 can also be controlled to display corresponding PET and MR image slices side-by-side. The reconstructed MR image can also be used to provide attenuation correction information for use in the PET reconstruction step 186.

In one embodiment, an attenuation correction unit 81 located in the reconstruction processor 80 generates an attenuation map, based at least in part on the reconstructed MR image. The attenuation map is used by the reconstruction processor 80 to generate attenuation corrected PET image representations. Information from the attenuation map is used to correct for errors resulting from non-uniform radiation attenuation characteristics of the patient or subject being examined (e.g., the presence of bones in a human patient).

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:
1. A combined PET/MR system comprising:
an MR subsystem including a main field magnet which generates a stationary magnetic field through an examination region, a gradient magnetic field system which applies magnetic field gradients across the examination region, and RF system that applies RF excitation pulses to excite resonance in a subject in the examination region and receive magnetic resonance signals from the subject;
a PET dectector module permanently or removably fixed in the examination region to detect radiopharmaceuticals in the subject;
a plurality of RF probes which measure magnetic field strength, the RF probes being mounted in the examination region in a fixed relationship to the PET module;
a gradient magnetic field distortion correction system that determines distortions caused in the gradient magnetic fields and corrects the magnetic resonance signals in accordance with the determined distortion;
an MR reconstruction system which reconstructs the corrected magnetic resonance signals into an image representation;
a plurality of PET detector units;
RF shielding which individually RF shields each PET detector unit;
an end plate on which the detector units are mounted; and
electronics for the PET detector units mounted to the end plate, the end plate and the PET detector electronics being RF shielded by the RF shielding.

2. The system according to claim 1, further including an RF shield which shields the PET detector module from RF pulses generated during a magnetic resonance imaging process.

3. The system according to claim 1, wherein each probe includes:
a sample of a substance which resonates in response to magnetic resonance excitation RF pulses applied by the magnetic resonance subsystem and a coil, disposed adjacent the substance, to receive a probe resonance signal whose frequency varies in accordance with a magnetic field gradient strength at the probe.

4. The system according to claim 1, wherein the gradient magnetic field distortion correction system includes:
a gradient deformation calculation unit which receives magnetic field strength signals from the probes, locations of the probes, and a description of the gradient magnetic field to be applied by the gradient system and calculates a deformation of the applied gradient magnetic field; and
a k-space transform calculating unit which calculates a transform which transforms received magnetic resonance data into linear k-space.

5. The system according to claim 1, wherein the PET module includes:
a plurality of PET detector units;
RF shielding which individually RF shields each PET detector unit;
wherein the RF shielded PET detector units are mounted in a circumferentially spaced relationship with a gap in between through which the RF excitation pulses and the magnetic resonance signals pass.

6. The system according to claim 5, wherein the PET detector units are linear and extend in a circumferentially-spaced relationship parallel to a transverse axis of the examination volume.

7. A combined PET/MR system comprising:
an MR subsystem including a main field magnet which generates a stationary magnetic field through an examination region, a gradient magnetic field system which applies magnetic field gradients across the examination region, and RF system that applies RF excitation pulses to excite resonance in a subject in the examination region and receive magnetic resonance signals from the subject; and
a plurality of PET detector units;
RF shielding which individually RF shields each PET detector unit;
wherein the RF shielded PET detector units are mounted in a circumferentially spaced relationship with a gap there between through which the RF excitation pulses and the magnetic resonance signals pass; and
wherein the PET detector units are linear and extend parallel to each other, and further including:
an end plate to which the PET detector units are connected at one end; and
PET detector electronics mounted on the end plate, the end plate and the PET detector electronics being shielded by the RF shielding.

8. The system according to claim 7, further including:
a plurality of RF probes which measure magnetic field strength, the RF probes being mounted in the examination region in a fixed relationship to the PET detector module;
a gradient magnetic field distortion system that determines the distortions caused in the gradient magnetic field and corrects the magnetic resonance signals in accordance with the determined distortion; and;
an MR reconstruction system which reconstructs the corrected magnetic resonance signals into an image representation.

9. The system according to claim 8, wherein the gradient magnetic field distortion correction system includes:
a gradient deformation calculation unit which receives magnetic field strength signals from the probes, locations of the probes, and a description of the gradient magnetic field to be applied by the gradient system and calculates a deformation of the applied gradient magnetic field; and
a k-space transform calculating unit which calculates a transform which transforms received magnetic resonance data into linear k-space.

10. A method of combined PET/MR imaging with a PET detector module permanently or removably fixed in an examination region of an MR scanner, the method comprising:
with the MR scanner, applying an MR imaging sequence including:
applying magnetic field gradients across the examination region, which applied magnetic field gradients are distorted by the PET detector module,
inducing magnetic resonance in a subject in the examination region,
receiving magnetic resonance signals from the subject;
with a plurality of RF probes which are mounted in a fixed relationship with the PET detector module, measuring magnetic field strength in the examination region during the application of the magnetic field gradients;
determining the distortions caused in the applied gradient magnetic fields and correcting received magnetic resonance signals in accordance with the determined distortion;
reconstructing the corrected magnetic resonance signals into an MR image representation; and
wherein the distortions in the gradient magnetic field are determined and the magnetic resonance signals are corrected during an magnetic resonance imaging scan.

11. The method according to claim 10, wherein determining the magnetic resonance distortion includes:

receiving signals from the probes indicative of magnetic field strength, a location of each probe, and a description of the magnetic field gradient which the magnetic resonance system intends to apply;

calculating a deformation in the applied gradient magnetic field;

determining a transform which transforms the deformed gradient magnetic fields into linear gradient magnetic fields; and correcting the magnetic resonance signals in accordance with the transform.

12. The method according to claim 10, wherein the distortions in the gradient magnetic field are determined prior to conducting a magnetic resonance imaging examination.

13. The method according to claim 10, wherein the PET detector module includes a plurality of spaced PET detector units and further including:

RF shielding the individual PET detector units such that the shielded PET detector units have gaps there between sufficient for RF excitation pulses and the magnetic resonance signals to pass through during the magnetic resonance imaging scan.

14. A method of combined PET/MR imaging with a PET detector module permanently or removably fixed in an examination region of an MR scanner, the method comprising:

with the MR scanner, applying an MR imaging sequence including:

applying magnetic field gradients across the examination region, which applied magnetic field gradients are distorted by the PET detector module, inducing magnetic resonance in a subject in the examination region, receiving magnetic resonance signals from the subject;

with a plurality of RF probes which are mounted in a fixed relationship with the PET detector module, measuring magnetic field strength in the examination region during the application of the magnetic field gradients;

determining the distortions caused in the applied gradient magnetic fields and correcting received magnetic resonance signals in accordance with the determined distortion;

reconstructing the corrected magnetic resonance signals into an MR image representation, further comprising:

reconstructing data from the PET detector module into a PET image representation using the MR image representation as an attenuation map.

15. The method according to claim 14, further including:

combining the MR image representation and the PET image representation.

16. A non-transitory computer-readable medium carrying software for controlling one or more processors to perform the method of claim 10.

17. A PET detector insert for use in the combined PET/MR system according to claim 1, the PET detector insert being configured to be removably mounted in the examination region to detect radiation from the radiopharmaceuticals injected into the subject, the PET detector insert including:

a plurality of PET detector units;

RF shielding which individually RF shields each PET detector unit;

wherein the RF shielded PET detector units are mounted in a circumferentially spaced relationship with a gap there between through which the RF excitation pulses and the magnetic resonance signals pass.

* * * * *